CHIME GENERATOR CIRCUIT FOR A P.A. AMPLIFIER
Filed Aug. 25, 1967
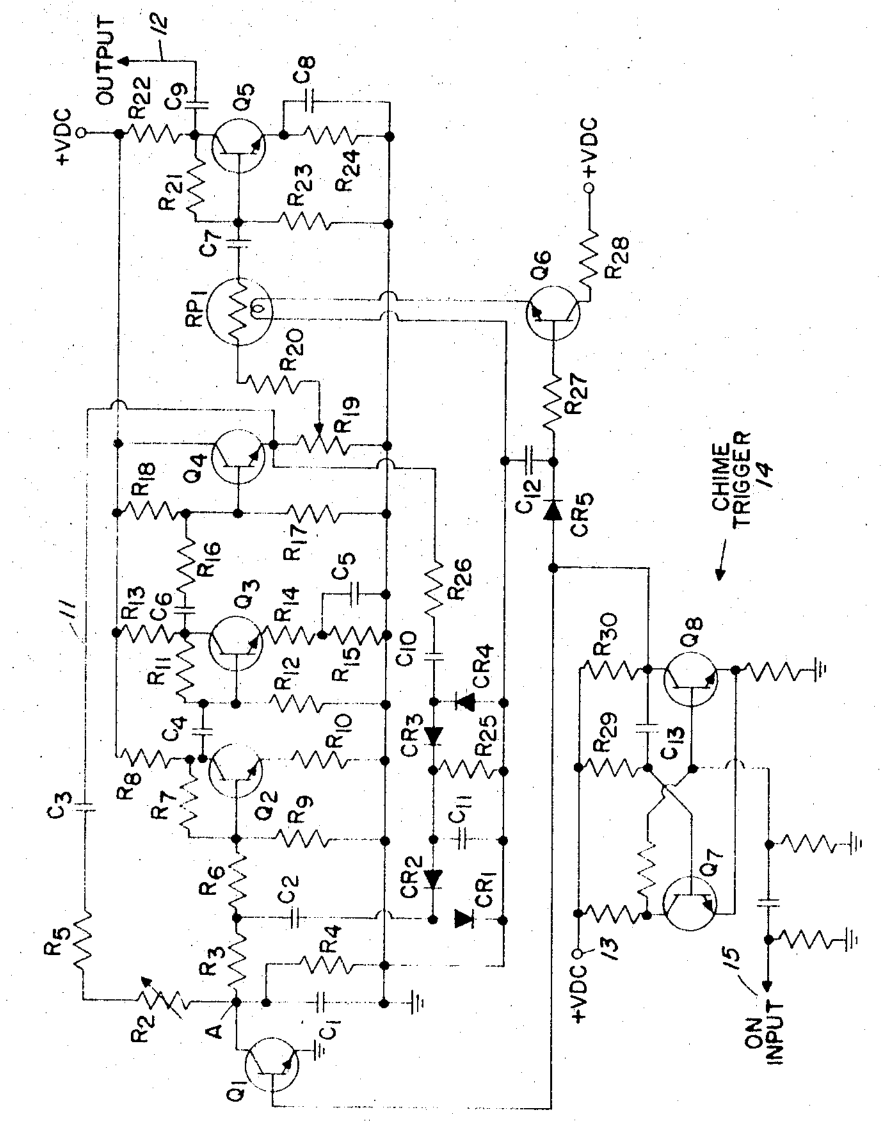
INVENTOR.
ARTHUR L. KEMPER
BY Mandy & Wallace
ATTORNEYS United States Patent Office 3,465,262

Patented Sept. 2, 1969

3,465,262

CHIME GENERATOR CIRCUIT FOR A P.A. AMPLIFIER

Arthur L. Kemper, Marion, Iowa, assignor to Collins Radio Company, Cedar Rapids, Iowa, a corporation of Iowa Filed Aug. 25, 1967, Ser. No. 663,254
Int. Cl. H03b 3/02
U.S. Cl. 331—109 2 Claims

ABSTRACT OF THE DISCLOSURE

Disclosed is a chime generator circuit which is frequency stable and the output of which is not distorted by saturation of the amplifier components. These advantages are obtained by shunting a portion of the amplifier input to ground through a feedback network which is sensitive to the output voltage. The output voltage is therefore nearly constant and the amplifier operates in a compressed state and consequently the output is not distorted by saturation of the amplifying elements. A chime trigger flip-flop initiates oscillation of the amplifier by removing a ground connection to the amplifier input, and allowing maximum feedback to the input. Light sensitive resistor means at the amplifier output increases in resistance in response to actuation of the chime trigger, and a percussive effect with an exponential decay is produced at the chime generator output.

This invention relates generally to oscillators and particularly to a chime generator circuit for use with a passenger address amplifier.

The passenger address systems in aircraft, buses and terminals for such transportation media ordinarily attract the attention of the passengers by a chime before the information to be related to the passenger is given. Several prior art systems exist for electronically producing the chime output. In such prior art systems the output of an amplifier is fed back to the input of the amplifier so that it serves as an oscillator. These systems suffer the disadvantage of having the oscillator output limited by the saturation of the transistor elements which compose the amplifier. This problem can be avoided in the prior art systems by adjusting the feedback voltage such that the circuit just barely oscillates. This then raises the different problem of causing the circuit to be very sensitive to gain variations of the transistors which compose the amplifier circuits. The circuits are also very sensitive to variations in supply voltages and changes of component values due to temperature changes, etc.

The inventive circuit described herein avoids these difficulties by shunting a portion of the input to ground as a function of the output. The amplifier circuitry then operates in a compressed state and the feedback does not distort the output signal. The oscillator then becomes frequency stable and the output becomes a nearly perfect sinusoidal wave because the output is no longer dependent upon the cutoff or saturation of the amplifier circuitry.

It is therefore an object of this invention to provide a chime generator circuit for a passenger address system which is frequency stable and has an undistorted output.

It is another object to provide such a system in which the oscillator circuit is in operation only during the interval in which the chime frequency is generated to thereby reduce the noise picked up in the main amplifier system.

It is another object to provide such a system in which the output is nearly constant irrespective of transistor gain variations or input voltage variations.

It is another object to provide such a chime generator which can be activated by use of a transistorized flip-flop circuit or other logic circuitry.

Further objects, features, and advantages of the invention will become apparent from the following description and claims when read in view of the accompanying drawing in which:

The figure shows a simplified schematic diagram of the chime generator circuit which composes this invention.

As shown in the figure, the chime generator is composed of two cascaded common emitter amplifiers identified as $Q_2$ and $Q_3$. The output of transistor $Q_3$ is fed to the base of transistor $Q_4$ which is connected as an emitter follower. The output of transistor $Q_4$ is fed back to the input of amplifier transistor $Q_2$ by way of line 11 through resistors $R_2$ and $R_5$ and capacitor $C_3$. Resistor $R_2$ is adjustable to provide a fine frequency adjustment. The output of the chime generator is taken off line 12 through a light sensitive resistor $RP_1$. The photo-sensitive resistor $RP_1$ receives its input from an adjustable resistor $R_{19}$. The output of emitter follower $Q_4$ is also fed back to the input of amplifier $Q_2$ through a network of diodes $CR_1$, $CR_2$, $CR_3$, $CR_4$, resistor $R_{26}$, and capacitor $C_{10}$. The operation and purpose of this second feedback system will be more fully described hereinafter. The oscillator circuit is activated by a DC voltage source 13 through resistor $R_{30}$ which forms a part of chime trigger flip-flop circuit 14. Flip-flop circuit 14 is an ordinary flip-flop circuit the operation of which is known in the art and therefore further details will not be presented herein. The percussive chime effect is initiated by applying a positive input pulse to the "On" input 15 of chime trigger circuit 14.

In operation transistors $Q_2$ and $Q_3$ are common emitter amplifiers with sufficient gain to oscillate with the feedback circuit shown. Transistor $Q_4$ is an emitter follower buffer to isolate load changes from the oscillator circuit. Because there is 180 degrees of phase shift in both transistors $Q_2$ and $Q_3$ and no phase shift in $Q_4$, the output of $Q_4$ is in phase with the input $Q_2$ and the circuit oscillates with sufficient feedbacks from $Q_4$.

The feedback network is comprised of capacitor $C_3$ and resistors $R_2$ and $R_5$ in series, and capacitors $C_1$ and resistor $R_4$ in parallel. The junction A of the series parallel combination is connected through isolation resistors $R_3$ and $R_6$ to the base of transistor $Q_2$.

The feedback components capacitors $C_1$, $C_3$, and resistors $R_2$, $R_4$ and $R_5$ are chosen so that a 45° current-voltage relationship exists in both the series and parallel circuits at the operating frequency. Because the output is taken from the junction A of these two circuits the feedback voltage is in phase with the input voltage. Resistor $R_2$ is adjustable to provide a fine frequency adjustment means.

In the circuit thus far described the output of the oscillator would be limited by cut off and saturation of transistors $Q_2$ and $Q_3$ and the output would be clipped and distorted. This could be avoided and a sine wave output could be obtained by carefully adjusting the amount of feedback so that the circuit just barely oscillates. However, under these conditions the circuit would be very sensitive to gain variations in the transistors, small changes in supply voltage or small variations in other component values due to temperature changes, etc.

The inventive circuit described herein eliminates these problems by shunting a portion of the input voltage to ground as the output voltage varies. The emitter voltage of transmitter $Q_4$ is voltage doubled and rectified by capacitor $C_{10}$ and diodes $CR_3$ and $CR_4$ which are present in the second feedback path. The resultant DC voltage causes increased current to flow through diodes $CR_1$ and $CR_2$ which lowers their impedance and hence shunts a portion of the input signal through capacitor $C_2$ and diode $CR_1$ to ground. The current through $CR_1$ and $CR_2$ is a function of the voltage received from $Q_4$ through diodes $CR_3$ and $CR_4$. The amount of voltage shunted from the input voltage therefore varies as the output voltage varies. The amplifier therefore operates in a compressed state with a nearly constant output voltage. A generous amount of feedback can now be used without distorting the output. Frequency stability is increased because transistors $Q_2$ and $Q_3$ are always operating at approximately the same AC signal level and the output is essentially a sine wave since it is no longer determined by saturation or cut-off of transistors $Q_2$ and $Q_3$.

The basic chime requirement calls for a percussive type sinusoidal tone which decays in magnitude at least 30 db in 900 m.s. In the inventive circuit a light controlled resistor (photoresistor) $RP_1$ is used. This photo-sensitive resistor exhibits minimum resistance when the internal lamp is full on. A positive voltage is applied to the anode of diode $CR_5$ through resistor $R_{30}$. Transistor $Q_6$ is turned on by this voltage and photoresistor $RP_1$ has its minimum value which ordinarily would result in maximum output from $Q_5$. However, in the inventive circuit there is no output from $Q_5$ because the positive voltage at the anode of $CR_5$ has also turned on transistor $Q_1$ which shorts out the oscillator feedback voltage.

When an On pulse actuates the On input of the chime trigger flip-flop circuit 14, the DC output voltage at the collector of $Q_8$ drops appreciably. This change of voltage decreases the positive voltage present at the anode of diode $CR_5$ and turns the oscillator on because transistor $Q_1$ is no longer conductive and therefore the feedback voltage is applied to the base of $Q_2$. The sudden application of the high feedback voltage to the amplifiers results in a fast attack time and the output is a percussive effect. The application of the On pulse also turns off transistor $Q_6$; photoresistor $RP_1$ is therefore turned off so that the output voltage from $Q_5$ decays exponentially. The rate of decay can be adjusted by varying the RC time constant of $C_{12}$ and $R_{27}$ and by varying the resistance $R_{20}$ in series with the photoresistor $RP_1$. The amount of feedback which can now be used substantially increases without adversely affecting the stability of the oscillator or distorting the output. Because the oscillator has an abundance of feedback the attack time is fast and the maximum output is reached in less than 50 milliseconds giving rise to a percussive sound. The percussive effect is further enhanced by delaying the action of the compressor circuit slightly. This can be brought about by varying resistor $R_{26}$ in the compressor feedback circuit. At the end of the chime interval, as determined by the RC time constant of flip-flop resistor $R_{29}$ and capacitor $C_{13}$, the oscillator is turned off and the photoresistor $RP_1$ is turned on in preparation for the next chime pulse.

Although this invention has been described with respect to a particular embodiment thereof, it is not to be so limited as changes and modifications may be made therein which are within the spirit and scope of the invention as defined by the appended claims.

I claim:

1. A chime generator circuit comprising amplifier means having an input and an output, a first feedback circuit connected between said output and said input for providing an oscillation producing voltage to said input, a second feedback circuit connected between said output and said input including a current sensitive variable resistor connected between said input and circuit ground, said current sensitive variable resistor varying in resistance inversely to the voltage at said output, switch means connecting said input to ground, chime trigger means for receiving a chime signal input and in response thereto opening said switch means momentarily thereby allowing said amplifier means to oscillate, and an output variable resistor connecting said output of said amplifier means and the chime generator circuit output, said output variable resistor being responsive to said chime trigger means whereby said variable resistor increases in resistance following a chime signal input.

2. A chime generator circuit as defined by claim 1 wherein said output variable resistor is a light sensitive resistor having a filament, the resistance of said light sensitive resistor varying inversely to the current flowing through said filament.

References Cited

UNITED STATES PATENTS

| | | | |
|---|---|---|---|
| 3,154,752 | 10/1964 | Brauer | 331—173 |
| 3,127,577 | 3/1964 | Lapointe | 331—141 |
| 3,225,313 | 12/1965 | Rexroad | 331—166 |
| 3,317,854 | 5/1967 | Liska et al. | 331—110 |
| 3,388,257 | 6/1968 | Ten Eyck | 331—66 |

OTHER REFERENCES

Hewlett-Packard Journal, vol. 16, No. 10, p. 3, June 1965.

JOHN KOMINSKI, Primary Examiner

U.S. Cl. X.R.

331—66, 110, 141, 183, 172